(12) United States Patent
Lee et al.

(10) Patent No.: US 10,305,006 B2
(45) Date of Patent: May 28, 2019

(54) LIGHT-EMITTING DEVICE AND LIGHTING DEVICE HAVING SAME

(71) Applicant: LG INNOTEK CO., LTD., Seoul (KR)

(72) Inventors: Koh Eun Lee, Seoul (KR); Yon Tae Moon, Seoul (KR); Ga Yeon Kim, Seoul (KR); Yun Soo Song, Seoul (KR); Hwan Hee Jeong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/770,862

(22) PCT Filed: Nov. 2, 2016

(86) PCT No.: PCT/KR2016/012523
§ 371 (c)(1),
(2) Date: Apr. 25, 2018

(87) PCT Pub. No.: WO2017/078399
PCT Pub. Date: May 11, 2017

(65) Prior Publication Data
US 2018/0315908 A1    Nov. 1, 2018

(30) Foreign Application Priority Data
Nov. 4, 2015 (KR) .................. 10-2015-0154390

(51) Int. Cl.
*H01L 25/16* (2006.01)
*H01L 33/40* (2010.01)
(Continued)

(52) U.S. Cl.
CPC ............ *H01L 33/60* (2013.01); *H01L 33/405* (2013.01); *H01L 33/46* (2013.01); *H01L 33/486* (2013.01);
(Continued)

(58) Field of Classification Search
CPC ......... H01L 33/60; H01L 33/62; H01L 33/50; H01L 33/502; H01L 33/46; H01L 33/405
See application file for complete search history.

(56) References Cited

U.S. PATENT DOCUMENTS

2006/0152140 A1   7/2006  Brandes
2013/0039058 A1   2/2013  Yun et al.
(Continued)

FOREIGN PATENT DOCUMENTS

JP    2013-219397 A    10/2013
JP    2015-41709 A      3/2015
(Continued)

OTHER PUBLICATIONS

International Search Report (PCT/ISA/210) issued in PCT/KR2016/012523, dated Feb. 17, 2017.

*Primary Examiner* — Ngan V Ngo
(74) *Attorney, Agent, or Firm* — Birch, Stewart, Kolasch & Birch, LLP

(57) ABSTRACT

According to an embodiment, a light-emitting device is disclosed. The disclosed light-emitting device comprises: a substrate having a body and first and second lead electrodes on the body; a light-emitting chip arranged on the second lead electrode and electrically connected to the first and second lead electrodes; a phosphor film arranged on the light-emitting chip; a reflective member arranged on the outer peripheries of the light-emitting chip and the phosphor film, respectively; and an optical lens, which is arranged on the phosphor film and on the reflective member, and which has a lens portion that has an aspherical shape.

19 Claims, 8 Drawing Sheets

(51) Int. Cl.
*H01L 33/46* (2010.01)
*H01L 33/48* (2010.01)
*H01L 33/50* (2010.01)
*H01L 33/58* (2010.01)
*H01L 33/60* (2010.01)
*H01L 33/62* (2010.01)
*H01L 33/64* (2010.01)

(52) U.S. Cl.
CPC ............ *H01L 33/50* (2013.01); *H01L 33/502* (2013.01); *H01L 33/505* (2013.01); *H01L 33/58* (2013.01); *H01L 33/62* (2013.01); *H01L 33/644* (2013.01); *H01L 25/167* (2013.01)

(56) References Cited

U.S. PATENT DOCUMENTS

| | | | | |
|---|---|---|---|---|
| 2013/0070441 | A1* | 3/2013 | Moon | H01L 33/486 362/84 |
| 2013/0181247 | A1 | 7/2013 | Jerebic et al. | |
| 2014/0061704 | A1* | 3/2014 | Yamada | H01L 33/62 257/98 |
| 2014/0239328 | A1* | 8/2014 | Lee | H01L 33/62 257/98 |
| 2015/0054011 | A1 | 2/2015 | Koizumi et al. | |
| 2016/0240746 | A1* | 8/2016 | Yun | H01L 33/56 |
| 2018/0069160 | A1* | 3/2018 | Kamada | H01L 24/32 |
| 2018/0212118 | A1* | 7/2018 | Chen | H01L 33/486 |
| 2018/0226542 | A1* | 8/2018 | Park | H01L 33/12 |

FOREIGN PATENT DOCUMENTS

| | | |
|---|---|---|
| JP | 5689225 B2 | 3/2015 |
| KR | 10-2011-0137836 A | 12/2011 |
| KR | 10-2013-0016940 A | 2/2013 |
| KR | 10-2013-0058729 A | 6/2013 |
| KR | 10-2014-0023682 A | 2/2014 |
| KR | 10-2014-0105295 A | 9/2014 |

* cited by examiner

[FIG. 1]
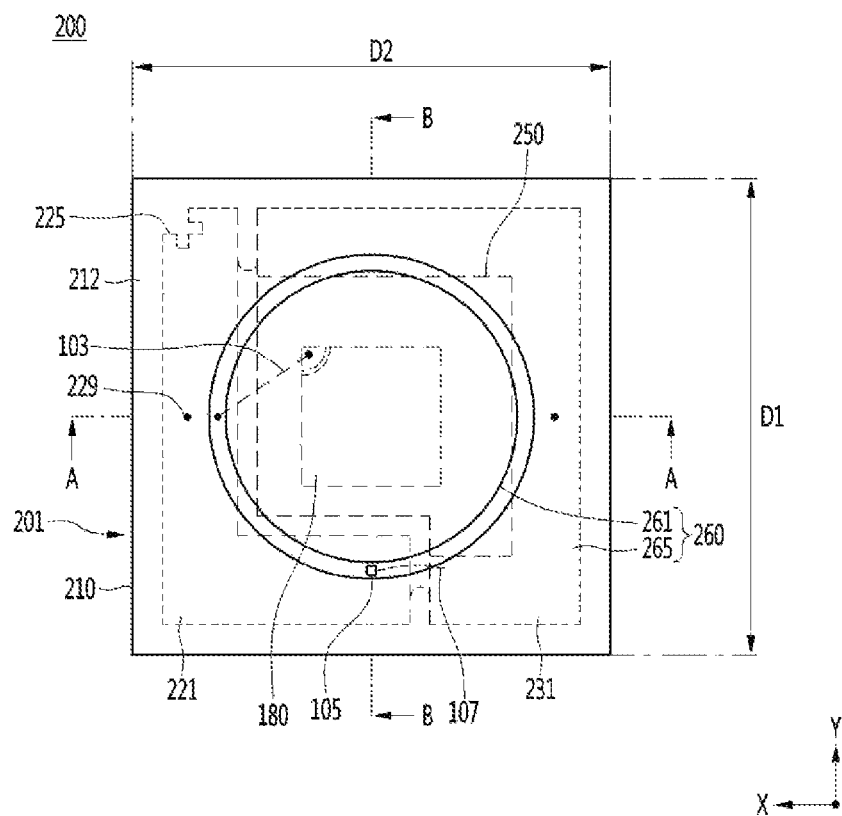

【FIG. 2】
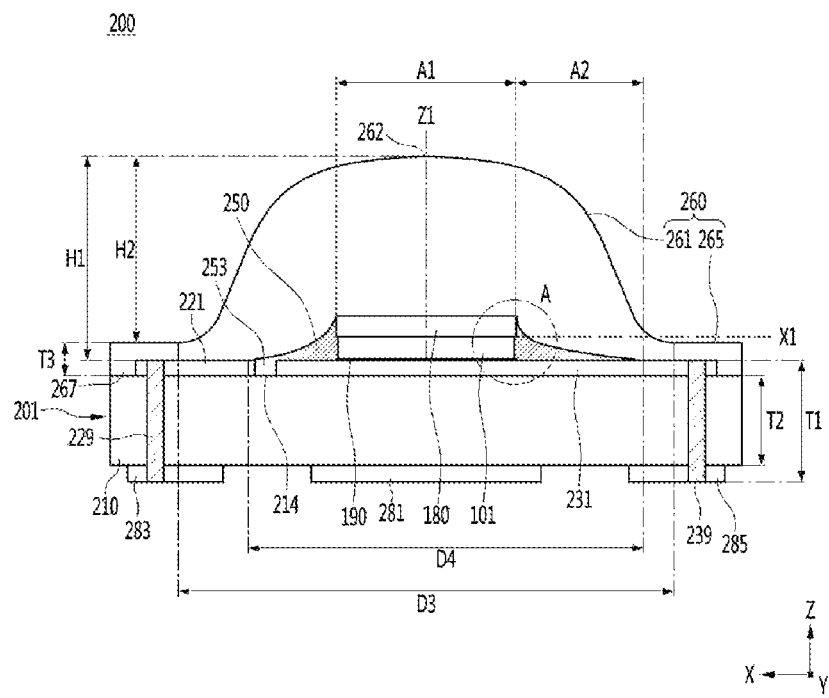
【FIG. 3】
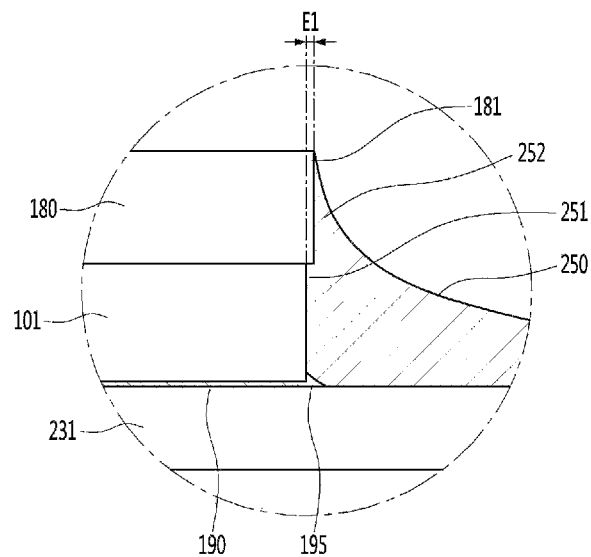

[FIG. 4]
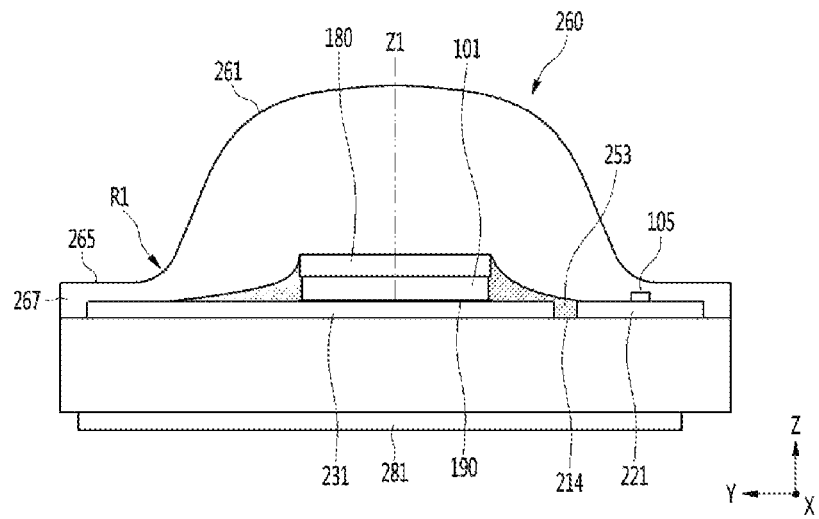
[FIG. 5]
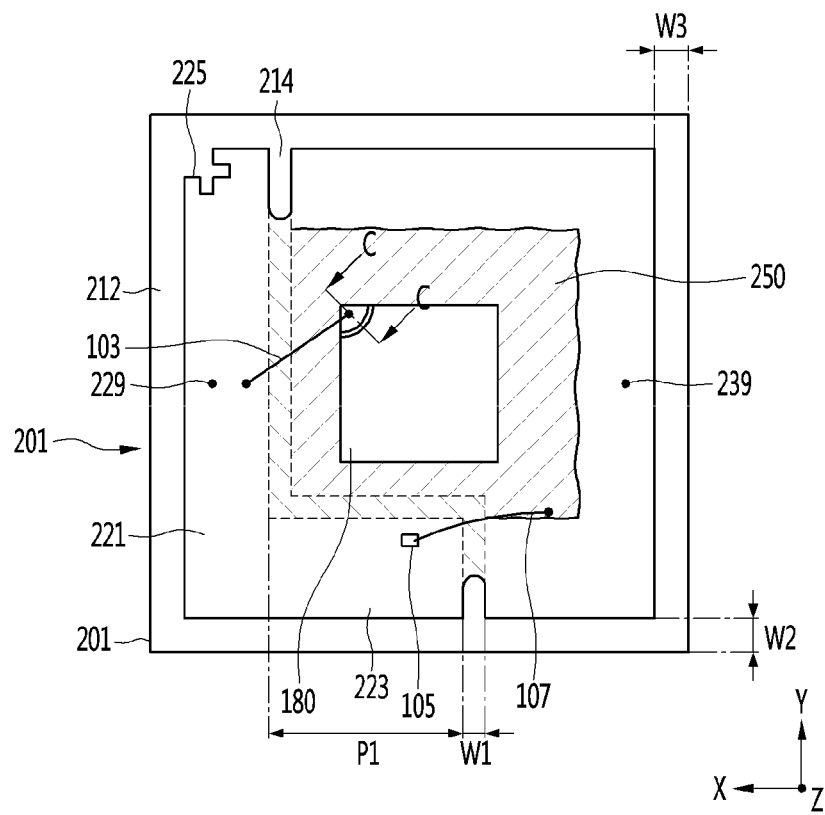

【FIG. 6】
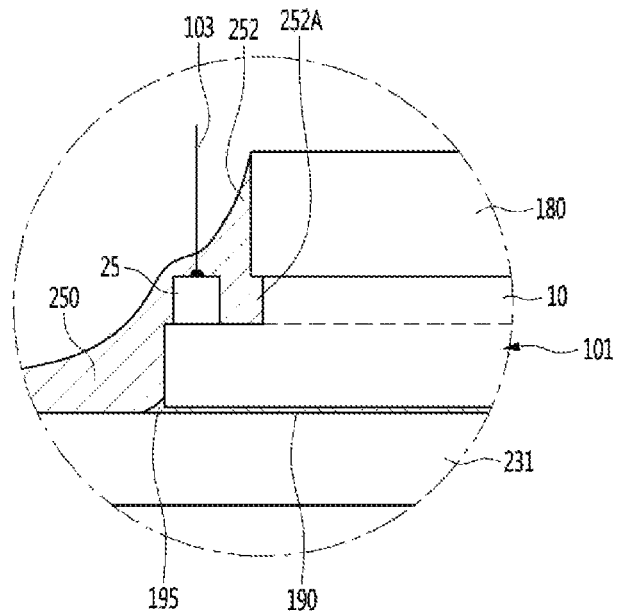
【FIG. 7】
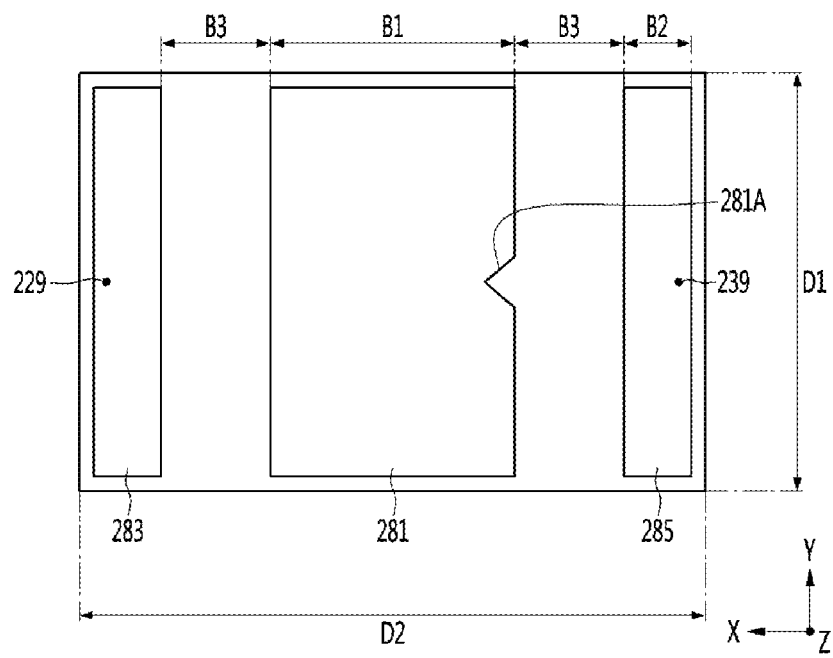

【FIG. 8】
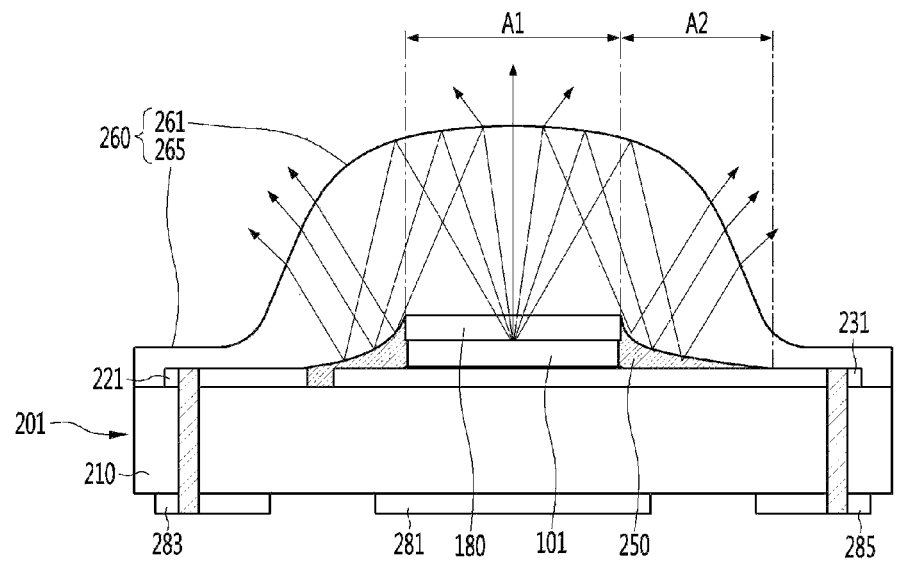
【FIG. 9】
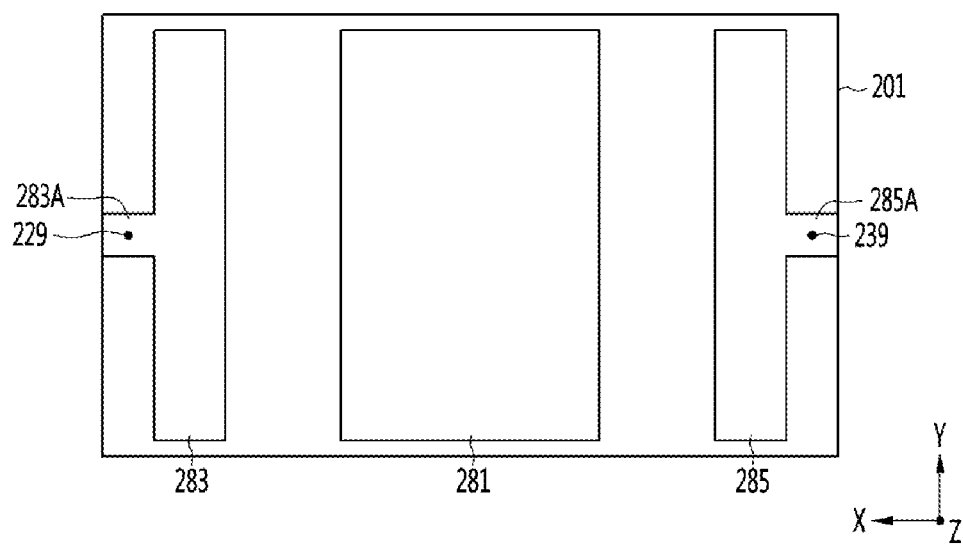

[FIG. 10]
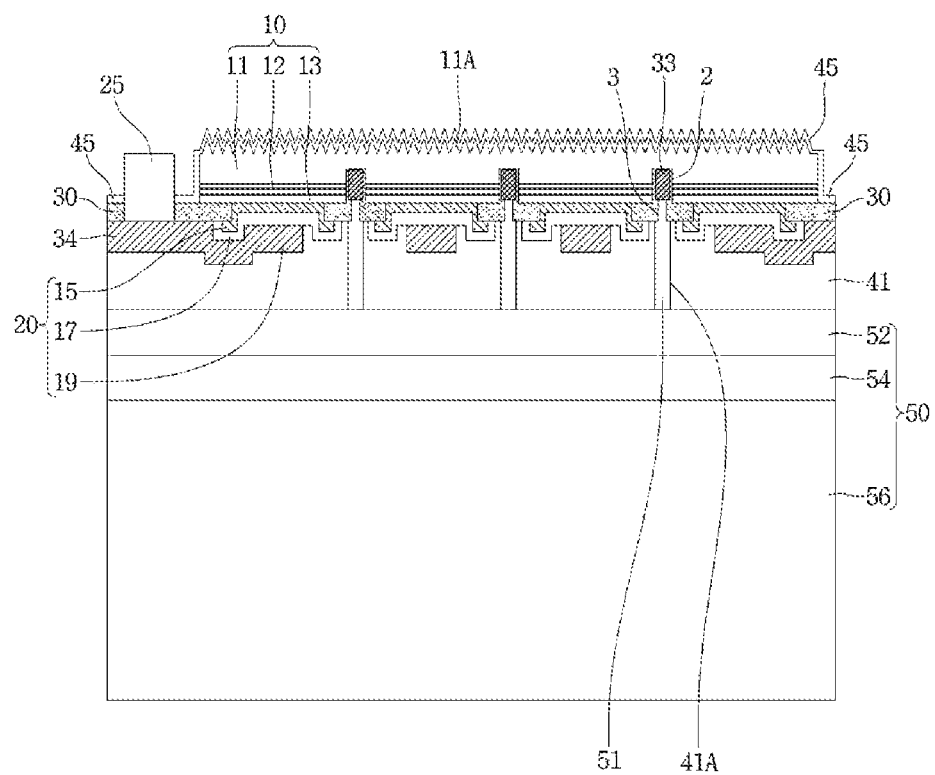

[FIG. 11]
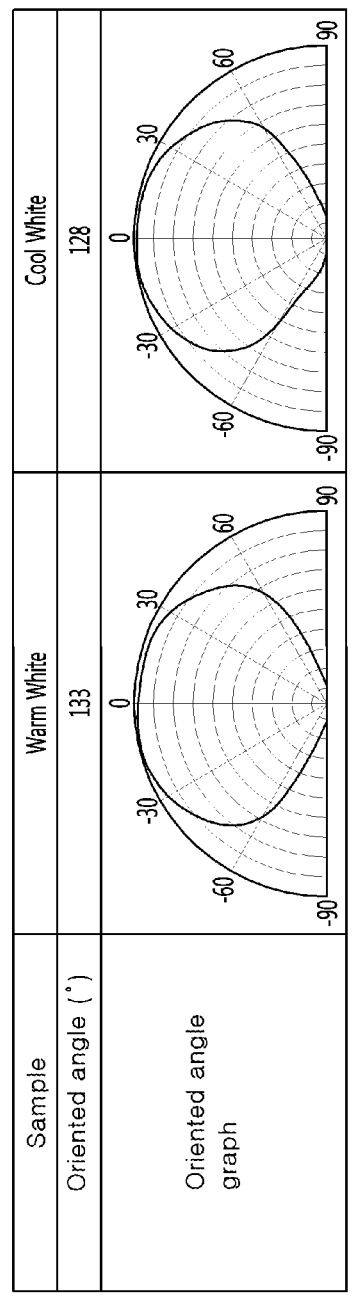

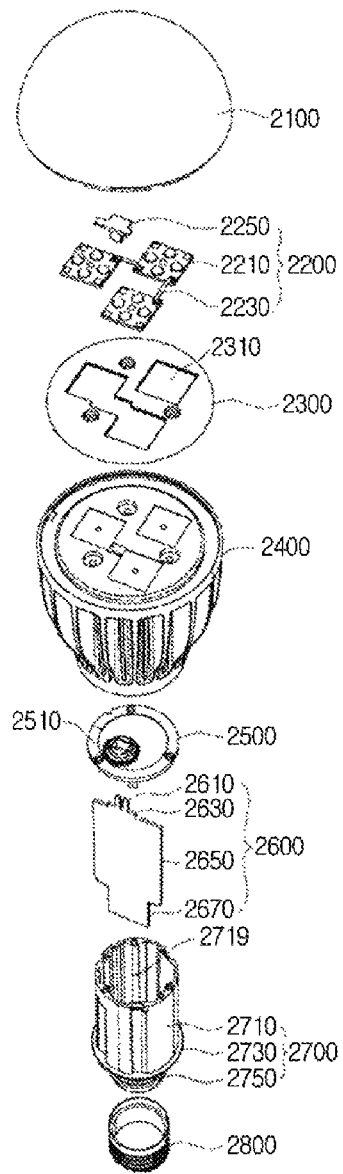
[FIG. 12]

LIGHT-EMITTING DEVICE AND LIGHTING DEVICE HAVING SAME

CROSS REFERENCE TO RELATED APPLICATIONS

This application is the National Phase of PCT International Application No. PCT/KR2016/012523, filed on Nov. 2, 2016, which claims priority under 35 U.S.C. 119(a) to Patent Application No. 10-2015-0154390, filed in the Republic of Korea on Nov. 4, 2015, all of which are hereby expressly incorporated by reference into the present application.

TECHNICAL FIELD

The present invention relates to a light-emitting device and a lighting device having the light-emitting device.

BACKGROUND ART

A light emitting device may have, for example, a light emitting diode. The light emitting diode, which is a kind of a semiconductor device for converting electrical energy into light, has been spotlighted as a next generation light source in substitution for a conventional phosphor lamp and a glow lamp.

Since the light emitting diode generates the light by using the semiconductor device, the light emitting diode may represent significantly low power consumption as compared with the glow lamp that generates the light by heating tungsten or the phosphor lamp that generates the light by urging ultraviolet ray, which is generated through the high-voltage discharge, to collide with a phosphor substance.

In addition, since the light emitting diode generates the light by using the potential gap of the semiconductor device, the light emitting diode represents a longer lifespan, a rapider response characteristic, and a more eco-friendly feature as compared with those of a conventional light source.

In this regard, various studies and researches have been performed to substitute the conventional light source with the light emitting diode. The light emitting diode is increasingly used as light sources for lighting devices, such as various lamps used indoors and outdoors, liquid crystal displays, electric signboards, and street lamps.

DISCLOSURE

Technical Problem

An embodiment provides a light-emitting device in which a reflective member is disposed around a light-emitting chip.

An embodiment provides a light-emitting device in which a phosphor film is disposed on the light-emitting chip and a reflective member is disposed around the phosphor film.

An embodiment provides a light-emitting device in which an optical lens having an aspheric lens portion is disposed on the light-emitting chip.

An embodiment provides a light-emitting device having an aspheric lens portion on the light-emitting chip/phosphor film disposed on a ceramic substrate.

Technical Solution

A light-emitting device according to an embodiment includes: a substrate including a body and first and second lead electrodes on the body; a light-emitting chip disposed on the second lead electrode and electrically connected to the first and second lead electrodes; a phosphor film disposed on the light-emitting chip; a reflective member disposed around the outer sides of the light-emitting chip and the phosphor film; and an optical lens including an lens portion of an aspheric shape and disposed on the phosphor film and the reflective member.

According to an embodiment, the outer sides of the phosphor film may be disposed outside further than a side surface of the light-emitting chip.

According to an embodiment, the reflective member may include a resin material and ha a first reflective portion disposed between the phosphor film and the substrate and a second reflective portion disposed on a side surface of the phosphor film.

According to an embodiment, the light-emitting device may further include a conductive adhesive disposed between the light-emitting chip and the second lead electrode and connecting the light-emitting chip to the second lead electrode, the light-emitting chip may include a light-emitting structure and a pad disposed outside the light-emitting structure, and the reflective member may have a third reflective portion disposed between the light-emitting structure and the pad of the light-emitting chip.

According to an embodiment, the third reflective portion of the reflective member may be in contact with the pad and a portion of a wire connected to the pad.

According to an embodiment, a region between the reflective member, the phosphor film, and the light-emitting chip may have no voids.

According to an embodiment, the optical lens may have a buffer portion disposed on the substrate and extending from the lens portion, and the buffer portion may extend outside the first and second lead electrodes in contact with the body. The top surface of the buffer portion may be lower than the top surface of the light-emitting chip.

According to an embodiment, a portion of the reflective member may be disposed in a gap portion between the first and second lead electrodes and may extend close to the sides of the substrate further than the outline of the reflective member disposed on the top surface of the second lead electrode.

According to an embodiment, the lens portion of the optical lens may have a first region vertically overlapping the light-emitting chip and a second region vertically overlapping the reflective member. The first region may have a curved surface inclined in a direction parallel with the top surface of the light-emitting chip and the second region may have a curved surface inclined in a direction perpendicular to the top surface of the light-emitting chip.

According to an embodiment, the body may include a ceramic material and has a heat dissipation frame vertically overlapping the light-emitting chip and first and second lead frames connected to the first and second lead electrodes on a bottom surface of the body, a width of the heat dissipation frame in a first axial direction may be two or more times a widths of the first and second lead electrodes in the first axial direction, and a length of the heat dissipation frame in a second axial direction may be the same as a lengths of the first and second lead electrodes in the second axial direction and smaller than a length of the body in the second axial direction.

According to an embodiment, the light-emitting device may further include: a first connection electrode connecting the first lead electrode and the first lead frame to each other; and a second connection electrode connecting the second lead electrode and the second lead frame to each other, in which the a straight line connecting the first and second electrodes to each other may be disposed at the center portion of the light-emitting chip, and the gap between the first and second connection electrodes may be larger than the length of the bottom surface of the reflective member in the first axial direction. The first lead frame may have a first protrusion protruding toward a first side of the body, the second lead frame may have a second protrusion protruding toward a second side of the body, and the first and second protrusions may protrude in the opposite directions and vertically overlap the first and second connection electrodes.

According to an embodiment, the second lead electrode may be larger in area than the first lead electrode, the heat dissipation frame may vertically overlap the first and second lead electrodes, and the overlap area of the heat dissipation frame and the second lead electrode may be larger than the overlap area of the heat dissipation frame and the first lead electrode.

According to an embodiment, the first lead electrode may have an extension extending to an area close to the center portion of the light-emitting chip in the second axial direction, and include a protective chip disposed on the extension of the first lead electrode and a wire connecting the protective chip to the first lead electrode, and a protective chip may be disposed on the same line with the center portion of the light-emitting chip in the second axial direction.

According to an embodiment, the thickness of the optical lens may be in the range of 60% to 65% of the gap between the bottom surface of the substrate and the apex of the lens.

According to an embodiment, the body may have an edge region where the first and second lead electrodes are open, and the edge region may be defined around the edges of the body in the first axial direction and the second axial direction. The width of the edge region may be smaller than the gap between the first and second lead electrodes, and the first lead electrode may have a polarity mark disposed at a corner portion of the body and connected to the edge region.

According to an embodiment, the material of the optical lens may be further disposed between the reflective member and the phosphor film.

Advantageous Effects

An embodiment can provide a light-emitting device having an aspheric lens.

According to an embodiment, luminous flux can be improved by an aspheric optical lens.

According to an embodiment, a color separation phenomenon can be removed by the aspheric optical lens.

According to an embodiment, the view angle of the light-emitting device can be improved.

The light-emitting device according to an embodiment can improve light extraction efficiency by disposing a reflective member around a light-emitting chip.

The light-emitting device according to an embodiment can improve a light view angle by using the aspheric lens and the reflective member.

The light-emitting device according to an embodiment has improved reliability.

DESCRIPTION OF DRAWINGS

FIG. 1 is a plan view of a light-emitting device according to an embodiment.

FIG. 2 is a cross-sectional view taken along line A-A of the light-emitting device of FIG. 1.

FIG. 3 is an enlarged view of the portion A of FIG. 1.

FIG. 4 is a cross-sectional view taken along line B-B of the light-emitting device of FIG. 1.

FIG. 5 is an exemplary view showing the light-emitting device of FIG. 1 with an optical lens removed and with a reflective member disposed around a light-emitting chip.

FIG. 6 is a cross-sectional view taken along line C-C of FIG. 5.

FIG. 7 is an exemplary rear view of the light-emitting device of FIG. 1.

FIG. 8 is a view illustrating a light path of a light-emitting device according to an embodiment.

FIG. 9 is another exemplary rear view of the light-emitting device according to an embodiment.

FIG. 10 is an exemplary view of a light-emitting chip of a light-emitting device according to an embodiment.

FIG. 11 is a view showing a view angle of a light-emitting device according to an embodiment.

FIG. 12 is a view showing a lighting device having a light-emitting device according to an embodiment.

MODE FOR INVENTION

Hereinafter, the embodiment of the present invention will be described in detail with reference to accompanying drawings to allow those skilled in the art to easily reproduce the present invention. However, the present invention may be realized with various forms, but is not limited to following embodiments.

In the following description, when a predetermined part "includes" a predetermined component, the predetermined part does not exclude other components, but may further include other components unless otherwise indicate. In the description of the embodiments, it will be understood that, when a layer, a film, a region, or a plate is referred to as being "on" another layer, another film, another region, or another plate, it can be "directly" or "indirectly" on the other layer, film, region, plate, or one or more intervening layers may also be present. Meanwhile, when a layer, a film, a region, or a plate is referred to as being "directly on" another layer, another film, another region, or another plate, no intervening layer is absent.

Hereinafter, a light-emitting device according to an embodiment of the present invention is described with reference to FIGS. 1 to 7.

FIG. 1 is a plan view of a light-emitting device according to an embodiment, FIG. 2 is a cross-sectional view taken along line A-A of the light-emitting device of FIG. 1, FIG. 3 is an enlarged view of the portion A of FIG. 1, FIG. 4 is a cross-sectional view taken along line B-B of the light-emitting device of FIG. 1, FIG. 5 is an exemplary view showing the light-emitting device of FIG. 1 with an optical lens removed and with a reflective member disposed around a light-emitting chip, FIG. 6 is a cross-sectional view taken along line C-C of FIG. 5, and FIG. 7 is an exemplary rear view of the light-emitting device of FIG. 1.

Referring to FIGS. 1 to 7, a light-emitting device 200 includes: a substrate 201; a light-emitting chip 101 disposed on the substrate 201; a phosphor film 180 disposed on the light-emitting chip 101; a reflective member 250 disposed around the light-emitting chip 101 and the phosphor film 180; and an optical lens 260 having an aspheric lens portion 261 on the substrate 201.

The substrate 201 includes a body 210 and a plurality of lead electrodes 221 and 231 disposed on the top surface of the body 210. The body 210 includes an insulating material, for example, a ceramic material. The ceramic material includes low temperature co-fired ceramic (LTCC) or high temperature co-fired ceramic (HTCC). The material of the body 210 may be a metallic compound, for example, Al2O3, or AlN, and preferably it may contain aluminum nitride AlN or alumina $Al_2O_3$ or may contain a metal oxide having thermal conductivity of 140 W/mK or more.

The body 210, as another example, may be made of a resin-based insulation material, for example, resin such as Polyphthalamide (PPA). The body 210 may be made of silicon, epoxy resin, or thermosetting resin including plastic, or a high-heat resistant and high sunproof material. As another example, acid anhydride, an antioxidant, a release agent, a light reflecting material, an inorganic filler, a curing catalyst, a light stabilizer, a lubricant, and titanium dioxide may be selected added to the body 210. The body 210 may be made of at least one selected from a group of epoxy resin, modified epoxy resin, silicon resin, modified silicon resin, acrylic resin, and urethane resin. For example, a b-staged solid epoxy resin composite may be used by adding DBU (1,8-Diazabicyclo(5,4,0)undecene-7) as a curing catalyst and ethylene glycol, titanium oxide paint, and glass fiber as cocatalysts to epoxy resin and partially curing to epoxy resin composed of triglycidylisocyanurate, hydrogenated bisphenol A diglycidyl ether, etc., acid anhydride composed of hexa hydro phthalic anhydride, 3-methy hexa hydro phthalic anhydride, 4-methyl hexa hydro phthalic anhydride etc., by hearing, which does not limit the present invention.

The thickness T2 of the body 210 may be 1 mm or less, for example, in the range of 0.45 mm to 0.55 mm. The thickness T2 of the body 210 may be 40% or less of the thickness of the light-emitting device 200, for example, in the range of 25% to 32%, and can support the light-emitting device 200. The thickness T2 of the body 210 may be 50% or less of the height H1 of the optical lens 260. When the thickness T2 of the body 210 is smaller than the range, heat dissipation efficiency is reduced and the light-emitting device cannot be supported, and when it is larger than the range, improvement of heat dissipation efficiency is very small and the thickness T1 of the substrate 201 is increased.

The length D2 of the substrate 201 in the direction of a first axis X may be the same as or different from the length D1 in the direction of a second axis Y. The lengths D1 and D2 of the substrate 201 may be 3 mm or more, for example, in the range of 3 mm to 4 mm. When the lengths D1 and D2 are smaller than the range, the extraction efficiency of light that is emitted from the light-emitting chip 101 having a large area may be deteriorated, and when they are larger than the range, the materials may be wasted. The lengths D1 and D2 of the substrate 201 in the axes are larger than the thickness of the light-emitting device 200, so the light-emitting device 200 can be stably supported. As for the size of the light-emitting chip 101 on the substrate 201, the length of onside may be 0.8 mm or more, for example, in the range of 0.8~1.2 mm×0.8~1.2 mm. The lengths D1 and D2 of the substrate 201 may depend on the size of the light-emitting chip 101, but are not limited thereto.

Referring to FIGS. 1 and 2, the lead electrodes 221 and 231 on the body 210 of the substrate 201, for example, include a first lead electrode 221 and a second lead electrode 231. The first lead electrode 221 and the second lead electrode 231 may be electrically separated from each other and electrically connected to the light-emitting chip 101. For example, the light-emitting chip 101 may be electrically connected to the lead electrodes by being bonded to the top surface of the second electrode 231 through an adhesive 190 and being connected to the first electrode 221 through a wire 103. The area of the top surface of the second lead electrode 231 is larger than the area of the top surface of the first lead electrode 221, so heat from the light-emitting chip 101 may be dissipated or conducted to the body 210. The adhesive 190 may be a conductive material that electrically connects the light-emitting chip 101 and the second lead electrode 231 to each other.

The light emitting chip 101 may be disposed at the center area on the top surface of the substrate 201 and the second lead electrode 231 may be disposed at the center area or may extend to the center area on the top surface of the body 210.

As in FIG. 1, a polarity mark 225 may be disposed on any one of the first lead electrode 221 and the second lead electrode 231, for example, on the first lead electrode 221. The polarity mark 225 may be disposed at a corner area of the first lead electrode 221 to discriminate the corner area from other corner areas. The polarity mark 225 may be an anode mark or a cathode mark. The polarity mark 225 may be connected to the edge region adjacent to the corners of the body 210 and the first lead electrode 221 may be open.

The sides of the first lead electrode 221 and the sides of the second lead electrodes 231 may be spaced from the sides of the body 210. The first and second lead electrodes 221 and 231 may be open through the edge region 212 of the top surface of the body 210. The edge region 212 may be defined around the first and second lead electrodes 221 and 231. The edge region 212 of the body 210 may be defined between the sides of the body 210 and the sides of the first and second lead electrodes 221 and 231 without overlapping the first and second lead electrodes 221 and 231 in the Z-axial direction. The edge region 212 may be composed of an X-directional area, a Y-directional area, and X-Y axes-crossing areas along the edges of the body 210.

Referring to FIG. 5, the top surface of the body 210 is exposed through a gap portion 214 between the first lead electrode 221 and the second lead electrode 231, and the first lead electrode 221 and the second lead electrode 231 are electrically separated by the gap portion 241. The width W1 of the gap portion 214 or the gap between the first and second lead wires 221 and 231 may be larger than the gaps W2 and W3 between the sides of the body 210 and the sides of the first lead electrode 221 or the sides of the second lead electrode 231. The gaps W2 and W3 may be the width of the edge region 212. The gap between the first and second lead wires 221 and 231 may be the width of the gap portion.

Referring to FIGS. 5 and 7, the substrate may include a plurality of connection electrodes 229 and 239 in the body 210 and a plurality of lead frames 283 and 285 on the bottom surface of the body 210. The connection electrodes 229 and 239 may include at least one first connection electrode 229 connected to the first lead electrode 221 and at least one second connection electrode 239 connected to the second lead electrode 231. The lead frames 283 and 285 may include a first lead frame 283 connected to the first connection electrode 229 and a second lead frame 285 connected to the second connection electrode 239. The first connection electrode 229 connects the first lead electrode 221 and the first lead frame 283 to each other and the second connection electrode 239 connects the second lead electrode 231 and the second lead frame 285 to each other. The light-emitting chip 101 may be disposed on the straight line connecting the first and second electrodes 229 and 239 to each other, so a difference between current paths through the first and second connection electrodes 229 and 239 can be reduced. The distances from the first and second connection electrodes 229 and 239 to the light-emitting chip 101 may be the same. The first and second connection electrodes 229 and 239 may be disposed closer to the edges of the substrate 201 than the light emitting-chip 101. The first and second connection electrodes 229 and 239 may be disposed on a straight line connecting the centers of opposite sides of the light-emitting chip 101 and the centers of the opposite sides of the substrate 201.

The first lead electrode 221, second lead electrode 231, first lead frame 283, and second lead frame 285 may include a plurality of metals of titanium Ti, copper Cu, nickel Ni, gold Au, chrome Cr, tantalum Ta, white gold Pt, tin Sn, silver At, and phosphorus P, and may be formed in multiple layers. A silver Ag or aluminum At layer is formed on surfaces of the first and second lead electrodes 221 and 231, so the efficiency of reflecting incident light can be improved. A gold Au layer is formed on the first lead frame 283 and the second lead frame 285, so it is possible to prevent corrosion due to humidity and improve electrical reliability. The first lead electrode 221, second lead electrode 231, first lead frame 283, and second lead frame 285 may have thicknesses in the range of 85±5 μm, and the thicknesses are out of the range, the electrical characteristic and thermal conductive characteristic may be deteriorated. The first lead electrode 221, second lead electrode 231, first lead frame 283, and second lead frame 285 may have the same thickness. The first connection electrode 229 and the second connection electrode 239 may be made of the same material as the first lead electrode 221, but they are not limited thereto. The straight distance between the first connection electrode 229 and the second connection electrode 239 may be ½ or more of the length D2 of one side of the substrate 201, but it is not limited thereto. The gap between the first and second connection electrodes 229 and 239 may be larger than the length of one side of the light-emitting chip 101 and may be larger than the X-directional length of the bottom surface of the reflective member 260.

Referring to FIG. 7, the substrate 201 may have a heat dissipation frame 281 on the bottom surface. The heat dissipation frame 281 may have a thickness the same as those of the first lead frame 283 and the second lead frame 285 and may have an area larger than those of the first lead frame 283 and the second lead frame 285. The heat dissipation frame 281 may be electrically separated from the first lead frame 283 and the second lead frame 285. The heat dissipation frame 281 may be disposed to vertically overlap the light-emitting chip 101. The heat dissipation frame 281 may be disposed between the first lead frame 283 and the second lead frame 285 to be able to conduct heat from the light-emitting chip 101. The area of the bottom surface of the heat dissipation frame 281 may be two or more times the areas of the bottom surfaces of the first and second lead frames 283 and 285. The heat dissipation frame 281 may be disposed in parallel with the first and second lead frames 283 and 285.

As in FIG. 7, a polarity mark 281A for the adjacent second lead frame 285 may be formed at a portion of the heat dissipation frame 281, but it is not limited thereto. The heat dissipation frame 281 may overlap the first and second lead electrodes 221 and 231 in the vertical direction Z, in which the ratio of the area overlapping the second lead electrode 231 in the Z-axial direction may be larger than the ratio of the area overlapping the first lead electrode 221 in the Z-axial direction. Accordingly, the heat dissipation frame 281 and the second lead electrode 231 can effectively dissipate heat from the light-emitting chip 101.

The heat dissipation frame 281 may have a width B1 larger than the X-directional width B2 of the first lead frame 283 or the second lead frame 285, and the X-directional distance B3 from the first or second lead frame 283 or 285 may be larger than the width B2 of the first and second lead frames 283 and 285. The heat dissipation frame 281 and the first and second lead frames 283 and 285 may be bonded to a circuit board by an adhesive such as a solder. The Y-directional lengths of the heat dissipation frame 281 and the first and second lead frames 283 and 285 may be the same and may be 90% or more of the length D1.

FIG. 9 shows another example of the bottom surface of the substrate. Referring to FIG. 9, the first lead frame 283 has a first protrusion 283A protruding toward a first side of the body, the second lead frame 285 has a second protrusion 285A protruding toward a second side of the body, and the first and second protrusions 283A and 285A may protrude in the opposite directions and may be exposed to the sides of the substrate 201, but are not limited thereto. The first and second protrusions 283A and 285A may overlap the first and second connection electrodes 229 and 239 in the Z-axial direction, so two different electrodes can be maximally spaced from each other on a straight line passing through the center portion of a light-emitting chip.

Referring to FIGS. 2 to 6, the light-emitting chip 101 may be disposed on at least one of the first lead electrode 221 and the second lead electrode 231, and for example, may be disposed on the second lead electrode 231. The light-emitting chip 101 may be electrically connected to the second lead electrode 231 by a conductive adhesive 190. The adhesive 190 may be disposed on the bottom surface of the light emitting chip 101 and a portion 195 of the adhesive may be disposed along the sides of the light-emitting chip 101. The portion 195 of the adhesive 190 may be higher than the bottom surface of the light-emitting chip 101, where by the contact area can be increased. The surface of the portion 195 of the adhesive 190 may be in contact with the reflective member 250. As another example, the light-emitting chip 101 may be disposed in a flip-chip type on the first lead electrode 221 and the second lead electrode 231, but is not limited thereto.

The light-emitting chip 101 is a light source and selectively emits light within a wavelength band from the ultraviolet ray to the visual ray. The light-emitting chip 101 include an UV LED chip, a green LED chip, a block LED chip, a red LED chip, or an infrared LED chip. The light-emitting chip 101 may have a thickness of 30 μm or more, for example, in the range of 50 μm to 180 μm. As for the size of the light-emitting chip 101, one side may be at least 0.5 mm or more, for example, 0.8 mm or more. The light-emitting chip 101 may be change in thickness, depending on whether it is a horizontal chip or a vertical chip, and may be a vertical chip in the embodiment. The thickness of the vertical chip may depend on the size of the light-emitting chip 101, and for example, when a chip having a larger area, for example, of which one size is 1 mm or more is out of the range, improvement of the heat dissipation efficiency may be very small or the chip may be bent. The light-emitting chip 101 may be a polygonal shape, for example, a regular square or rectangular shape when seen from above. The light-emitting chip 101 may have a circular shape of another polygonal shape when seen from above, but is not limited thereto.

A protective chip 105 may be disposed on the first lead electrode 221. The first lead electrode 221 has an extension (223 in FIG. 5), the extension is elongated outside an area adjacent to the center portion of the light-emitting chip 101 in the second axial direction, and the protective chip 105 may be disposed on the extension 223. The protective chip 105 and the light-emitting chip 101 may be disposed on different lead electrodes 221 and 231. The protective chip

105 may be disposed on a Y-directional straight line passing through the center portion in the second axial direction. The Y-directional straight line passing through the center of the light emitting chip 101 may be perpendicular to the X-directional straight line passing through the first and second connection electrodes 229 and 239. The protective chip 105 may be bonded to the first lead electrode 221 and may be connected to the second lead electrode 231 through a wire 107. The protective chip 105 may be implemented by thyristor, a zener diode, or Transient voltage suppression (TVS). The protective chip 105 protects the light-emitting chip 101 from electro static discharge (ESD).

As in FIG. 3, the phosphor film 180 may be disposed on the light-emitting chip 101. The phosphor film 180 may have an area larger than the area of the top surface of the light-emitting chip 101. The area of the bottom surface of the phosphor film 180 may be larger than the area of the top surface of the light-emitting chip 101. The X-directional and Y-directional lengths of the phosphor film 180 may be larger than the X-directional and Y-directional lengths of the light-emitting chip 101. The outer side 181 of the phosphor film 180 may protrude a predetermined distance E1 outward further than the sides of the light-emitting chip 101. Since the outer side 181 of the phosphor film 180 protrudes outward further than the top surface of the light-emitting chip 101, it can receive even light out of the top surface area of the light-emitting chip 101. The length E1 of the outer side 181 may be 5 μm or more, for example, within the range of 5 μm to 15 μm. The area of the top surface may be larger than the area of the bottom surface in the phosphor film 180, but they are not limited thereto. The reflective member 250 may be in contact with the bottom surface of the outer side 181 of the phosphor film 180. As another example, a transmissive material is disposed between the outer side of the phosphor film 180 and the reflective member 250, so it is possible to reduce a loss of light at the interface between the phosphor film 180 and the reflective member 250. The transmissive material may be the body of a lens.

The phosphor film 180 absorbs some of the light emitted from the light-emitting chip 101 and changes the wavelength of the light into the wavelength of another light. The phosphor film 180 is formed by adding a phosphor to transmissive resin such as silicon or epoxy and the phosphor may include at least one of a yellow phosphor, a green phosphor, a blue phosphor, and a red phosphor. For example, the phosphor may be at least any one or more selected from a nitride-based phosphor that is usually activated by lanthanide-based elements such as Eu and Ce, an oxynitride-based phosphor, a sialon-based phosphor, an alkali-earth halogen apatite phosphor, alkali-earth metal boric acid halogen phosphor, an alkali-earth metal aluminate phosphor, alkali-earth silicate, alkali-earth sulfide, alkali-earth thiogallate, alkali-earth silicon nitride, and germinate that are usually activated by lanthanide-based elements such as Eu and transition metal-based elements such as Mu, or earth aluminate and earth silicate that are usually activated by lanthanide-based elements such as Ce, or organisms and organic complexes that are usually activated by lanthanide-based elements such as Eu. As a detailed example, these phosphors may be used, but the present invention is not limited thereto.

Light emitted from the phosphor film 180 and light emitted from the light-emitting chip 101 may be mixed in color, whereby they may be emitted as white light. The white light may have at least one color temperature of warm white, cool white, and neutral white.

The phosphor film 180 may thinner than the light-emitting chip 101. The phosphor film 180 may be formed with a thickness of 100 μm or less and when the thickness is larger than the value, improvement of wavelength conversion efficiency may be very small.

Since the phosphor film 180 is provided as a film type, the top surface and bottom surface may be horizontal flat surfaces and the outer side 181 of the phosphor film 180 can be prevented from sagging.

The reflective member 250 may be disposed around the light-emitting chip 101. The reflective member 250 is formed by adding metal oxide to a resin material. The resin material includes silicon or epoxy and the metal oxide, which is a material having a higher refractive index than the resin material, for example, may include at least one of $Al_2O_3$, $TiO_2$, and $SiO_2$. The metal oxide is 5 wt % or more, for example, in the range of 5~30 wt % in the reflective member 250. The reflective member 250 may have reflectance of 90% or more for the light emitted from the light-emitting chip 101.

The reflective member 250 may be disposed around the phosphor film 180. The reflective member 250 may be in contact with the sides of the light-emitting chip 101 and the sides of the phosphor film 180. The reflective member 250 includes a first reflective portion 251 disposed between the phosphor film 180 and the substrate 201 and a second reflective portion 252 disposed on the sides of the phosphor film 180. The first reflective portion 251 is disposed along the sides of the light-emitting chip 101 and may be disposed inside further than the outer side of the phosphor film 180. The second reflective member 252 may be disposed along the sides of the phosphor film 180 and may be disposed higher than the top surface of the light-emitting chip 101. The second reflective member 252 may become thinner as it goes to the top surface of the phosphor film 180. As another example, a transparent material may be disposed between the reflective member 250 and the light-emitting chip 101. The transparent material can prevent light emitted from the sides of the light-emitting chip 101 from being lost between the light-emitting chip 101 and the reflective member 250 and the light can be reflected upward.

The upper end of the reflective member 250 may be level with or lower than the top surface of the phosphor film 180. The second reflective portion 252 of the reflective member 250 can reflect light emitted from the sides of the phosphor film 180.

When the reflective member 250 is dispensed around the light-emitting chip 101, it may extend up to the sides of the phosphor film 180 by capillary action. Accordingly, there is no voids which is a region between the reflective member 250, the light-emitting chip 101, and the phosphor film 180, so bonding force for the areas between the reflective member 250, the light-emitting chip 101, and the phosphor film 180 can be increased.

As in FIGS. 2 and 4, the reflective member 250 may be disposed on the top surface of the second lead electrode 231. A portion 253 of the reflective member 250 may be disposed in the gap portion 241 between the first lead electrode 221 and the second lead electrode 231. The portion 253 of the reflective member 250 disposed in the gap portion 214 is in contact with the top surface of the body 210, so it can block humidity permeating through the gap portion 214.

The portion 253 of the reflective member 250 disposed in the gap portion 214 may extend close to the sides of the substrate 201 further than the outline of the reflective member 250 disposed on the top surface of the second lead electrode 231.

The surface of the reflective member 250 may provide a curved surface and the curved surface can reflect light traveling to the surface, as shown in FIG. 8. The portion 253 of the reflective member 250 disposed in the gap portion 214 may extend outward further than the lens portion 261 of the optical lens 260 in the Y-axial direction.

Referring to FIG. 6, a third reflective portion 252A of the reflective member 250 may be disposed in the area between the pad 25 of the light-emitting chip 101 and the light-emitting structure 10. The third reflective portion 252A of the reflective member 250 can prevent the light emitted from the light-emitting structure 10 from being absorbed by the pad 25. Since the third reflective portion 252A of the reflective member 250 is disposed in the area between the pad 25 and the light-emitting structure 10, it can support or protect the pad 25. The third reflective portion 252A supports the bonding portion of the wire 103 connected to the pad 25, so it can prevent the wire 103 from cutting. The third reflective portion 252A can cover the pad 25 and can be in contact with a portion of the wire 103.

Referring to FIGS. 1 to 5, the optical lens 260 may include an aspheric lens shape on the substrate 201. The optical lens 260 may be disposed in a curved shape, for example, an aspheric lens shape on the light-emitting chip 101 and the phosphor film 180.

The optical lens 260 may be in contact with the top surface of the phosphor film 180 and may extend to the top surface of the reflective member 250. The optical lens 260 may extend to the top surfaces of the first lead electrode 221 and the second lead electrode 231 disposed around the reflective member 250 and the top surface of the body 210.

The optical lens 260 may be made of transparent resin such as silicon or epoxy. As another example, the optical lens 260 may be made of glass or transparent plastic.

The optical lens 260 has the lens portion 261 and the buffer portion 265 and the lens portion 261 is disposed on the light-emitting chip 101 and the phosphor film 180 and has an aspheric lens shape. The lens portion 261 may overlap the light-emitting chip 101 and the phosphor film 280 in the Z-axial direction. The lent portion 261 may protrude at the center portion and may have a smooth curved surface around the center portion. According to an embodiment, the aspheric lens portion 261 is provided, so it can have a view angle wider than the view angle of a semispherical lens. The aspheric lens portion 261 is different from the structure that provides a semispherical lens in a flat shape, so it is possible to reduction of luminous flux. The height of the lens can be reduced by the aspheric lens portion 261. The height H1 of the lens portion 261 may be 1.4 mm or less, for example, in the range of 1.2±0.1 mm, and when the height H1 of the lens portion 261 is out of the range, the thickness of the light-emitting device 200 may be increased, and when it is less than the range, light extraction efficiency may be deteriorated. The height H1 of the lens portion 261 is the gap between the top surface of the substrate 201 and the apex of the lens portion 261. The thickness of the optical lens 260 having an aspheric shape is the height of the lens portion 261 and may be 65% or less of the thickness of the light-emitting device 200, for example, in the range of 60%~65%. The thickness of the light-emitting device 200 is the gap between the bottom surface of the substrate 201 and the apex of the lens portion 261.

Since the lens portion 261 of the optical lens 260 is an aspheric lens, the thickness H1 and the volume of the optical lens 260 can be reduced. Since the area around the center 262 of the optical lens 260, that is, around the apex is a smooth curved surface, it can be provided as a total reflection surface that reflects incident light. Accordingly, the optical lens 260 can improve luminous flux and can prevent the phenomenon that a color emitted from the light-emitting chip 101, for example, a blue ring is shown, whereby a color separation phenomenon can be improved.

The buffer portion 265 of the optical lens 260 may be disposed around the light-emitting chip 101 and may have a flat top surface. The buffer portion 265 of the optical lens 260 may extend outside the first and second lead electrodes 221 and 231 around the light-emitting chip 101. The buffer portion 265 may be in contact with the top surface of the body 210 in the area where the first and second lead electrodes 221 and 231 are not formed. The outer sides of the buffer portion 265 may be vertical surfaces the same as the sides of the body 210, but they are not limited thereto. The buffer portion 265 may be formed around the outer edges of the body 210, so it can prevent permeation of humidity. Since the reflective portion 250 is disposed on the sides of the light-emitting chip 101, the buffer portion 265 of the optical lens 260 can be disposed lower than the horizontal straight line X1 of the top surface of the light-emitting chip 101. Since light is not emitted from the sides of the light-emitting chip 101, the thickness T3 of the buffer portion 265 can be small. The thickness T3 of the buffer portion 265 may be 0.2 mm or less, for example, in the range of 0.08 mm to 0.14 mm. The thickness T3 of the buffer portion 265 may be the gap between the top surface of the body 210 and the top surface of the buffer portion 265.

The curved surface (R1 in FIG. 4) between the lens portion 261 and the buffer portion 265 of the optical lens 260 may have a radius of curvature within the range of 0.2±0.02 mm. The center of the radius of curvature between the lens portion 261 and the buffer portion 265 can be disposed over the buffer portion 265. The curved surface between the lens portion 261 and the buffer portion 265 of the optical lens 260 may be disposed on a straight line X2 parallel with the boundary line between the light-emitting chip 101 and the phosphor film 180.

Referring to FIGS. 2 and 8, the optical lens 260 may have a first region A1 vertically overlapping the light-emitting chip 101 and a second region A2 vertically overlapping the reflective member 250. The first region A1 is a smooth curved surface around the center 262 of the lens portion 261 and can transmit or reflect incident light. The second region A2 is a steep curved area extending from the first region A1 to a position close to the first lead electrode 221 and the second lead electrode 231 and transmits or reflects incident light. The first and second regions A1 and A2 may be provided as reflecting surfaces for incident light. The first region A1 may be a horizontally smooth curved surface over the top surface of the light-emitting chip 101 and the second region A2 may be a curved surface inclined in the light axis direction Z2 or a direction perpendicular to the top surface of the light-emitting chip 101.

Light reflected from the first region A1 and the second region A2 of the optical lens 260 travels to the reflective member 250, so the traveling path of the light is changed. Accordingly, the light emitted from the optical lens 260 can be diffused and provided with uniform light distribution. Accordingly, since the optical lens 260 provides the aspheric lens portion 261, the lens height is reduced and the emitted light is diffused, so the color separation phenomenon can be reduced.

Referring to FIG. 8, the optical lens 260 reflects the incident light traveling through the light-emitting chip 101 and the phosphor film 180 toward the reflective member 250, using the aspheric lens portion 261. Further, the light traveling to the reflective member 250 may be reflected outside through the second region A2 of the lens portion 261. Accordingly, the light traveling out of the optical lens 260 can uniformly travel. Further, it is possible to solve the problem due to the color ring that is formed by light traveling out of the optical lens 260 by increasing the amount of the light laterally reflected by the aspheric lens portion 261 of the optical lens 260.

The view angle of the light-emitting device having the optical lens 260 can be 125 degrees or more, for example, within the range of 125 degrees to 135 degrees, so the directional characteristic of light can be improved. Further, since the light-emitting device includes the reflective member 250 around the light-emitting chip 101, the luminous flux can be improved.

FIG. 11 shows a sample of a light-emitting device according to an embodiment, in which the view angle may be 133 degrees when it is a warm white, and may be 128 degrees when it is cool white. The difference of the view angle of warm white and cool white light-emitting devices may depend on the height of the optical lens. Accordingly, as for warm white, the light view angle of the light-emitting device can be increased by reducing the height (H1 in FIG. 2) of the optical lens, fore example, to 50 μm to 80 μm. The light-emitting device can provide a light view angle characteristic corresponding to a temperature color due to the height of the aspheric optical lens.

FIG. 10 is an example of a light emitting chip according to the embodiment.

Referring to FIG. 10, the light emitting chips 100 an 101 may include a light emitting structure having a plurality of semiconductor layers 11, 12, and 13, a first electrode layer 20 under the light emitting structure 10, a second electrode layer 50 under the first electrode layer 20, an insulating layer 41 between the first and second electrode layers 20 and 50, and a pal 25.

The light emitting structure 10 may include a first semiconductor layer 11, an active layer 12, and a second semiconductor layer 13. The active layer 12 may be disposed between the first and second semiconductor layers 11 and 13. The active layer 12 may be provided under the first semiconductor layer 11, and the second semiconductor layer 13 may be provided under the active layer 12.

For example, the first semiconductor layer 11 may include an n type semiconductor layer doped with a first conductive dopant, for example, an n type dopant, and the second semiconductor layer 13 may include a p type semiconductor layer doped with a second conductive dopant, for example, a p type dopant. In addition, the first semiconductor layer 11 may include the p type semiconductor, and the second semiconductor layer 13 may include the n type semiconductor layer.

A rough unevenness part 11A may be formed on the top surface of the first semiconductor layer 11. The unevenness part 11A may improve the light extraction efficiency. The side sectional view of the unevenness surface 11A may have a polygonal shape, or a semis-spherical shape.

The first electrode layer 20 is disposed between the light emitting structure 10 and the second electrode layer 50, electrically connected with the second semiconductor layer 13 of the light emitting structure 10, and electrically insulated from the second electrode layer 50. The first electrode layer 20 includes a first contact layer 15, a reflective layer 17, and a capping layer 19. The first contact layer 15 is disposed between the reflective layer 17 and the second semiconductor layer 13, and the reflective layer is disposed between the first contact layer 15 and the capping layer 19.

The first contact layer 15, the reflective layer 17, and the capping layer 19 may be formed of mutually conductive materials, but the embodiment is not limited thereto.

The first contact layer 15 may make contact with the second semiconductor layer 13, for example, an ohmic contact with the second semiconductor layer 13. The first contact layer 15 may be formed of, for example, a conductive oxide layer, a conductive nitride, or metal. For example, the first contact layer 15 may include at least one of ITO (Indium Tin Oxide), ITON (ITO Nitride), IZO (Indium Zinc Oxide), IZON (IZO Nitride), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, NiO, Pt, Ag, and Ti.

The reflective layer 17 may be electrically connected with the first contact layer 15 and the capping layer 19. The reflective layer 17 reflects light incident therein from the light emitting structure 10 to increase an amount of light to be extracted to the outside.

The reflective layer 17 may be formed of metal having at least 70% of a light reflective index. For example, the reflective layer 17 may be formed of metal including at least one of Ag, Ni, Al, Rh, Pd, Ir, Ru, Mg, Zn, Pt, Cu, Au, and Hf or the alloy thereof. In addition, the reflective layer 17 may be formed in a multi-layer using the metal or the alloy thereof and the transmissive material of ITO (Indium-Tin-Oxide), IZO (Indium-Zinc-Oxide), IZTO (Indium-Zinc-Tin-Oxide), IAZO (Indium-Aluminum-Zinc-Oxide), IGZO (Indium-Gallium-Zinc-Oxide), IGTO (Indium-Gallium-Tin-Oxide), AZO (Aluminum-Zinc-Oxide), or ATO (Antimony-Tin-Oxide). For example, according to the embodiment, the reflective layer 17 may include at least one of Ag, Al, an Ag—Pd—Cu alloy or an Ag—Cu alloy. For example, the reflective layer 17 may be formed by alternately arranging an Ag layer and a Ni layer, and may include Ni/Ag/Ni, a Ti layer or a Pt layer. According to another example, the first contact layer 15 may be formed under the reflective layer 17, and at least a portion of the first contact layer 15 passes through the first reflective layer 17 to make contact with the second semiconductor layer 13. According to another example, the reflective layer 17 may be provided under the first contact layer 15, and a portion of the reflective layer 17 may make contact with the second semiconductor layer 13 through the first adhesive layer 15.

The light emitting device according to the embodiment may include a capping layer 19 provided under the reflective layer 17. The capping layer 19 makes contact with the bottom surface of the reflective layer 17, and the contact part 34 is coupled to the pad 25 to serve as a wire layer to transfer power supplied from the pad 25. The capping layer 19 may be formed of metal. For example, the capping layer 19 may include at least one of Cu, Ni, Ti, Ti—W, Cr, W, Pt, V, Fe, and Mo.

The contact part 34 of the capping layer 19 is provided at a region that is not vertically overlapped with the light emitting structure 10, and perpendicularly overlapped with the pad 25. The contact part 34 of the capping layer 19 is provided at a region that is not vertically overlapped with the first contact layer 15 and the reflective layer 17. The contact part 34 of the capping layer 19 may be provided lower than the light emitting structure 10, and may make direct contact with the pad 25.

The pad 25 may be formed at a single layer or a multi-layer. In the case of the single layer, the pad 25 may include Au. In the case of the multi-layer, the pad 25 may include at least two of Ti, Ag, Cu, and Au. In this case of the multi-layer, the pad 25 may the stack structure of Ti/Ag/Cu/Au or Ti/Cu/Au. At least one of the reflective layer 17 and the first contact layer 15 may make directly contact with the pad 25, but the embodiment is not limited thereto.

The pad 25 may be provided at a region A1 between an outer sidewall of the first electrode layer 20 and the light emitting structure 10. The protective layer 30 and the transmissive layer 45 may make contact with a peripheral portion of the pad 25.

The protective layer 30 may be provided on the bottom surface of the light emitting structure 10, may make contact with the bottom surface of the second semiconductor layer 13 and the first contact layer 15, and may make contact with the reflective layer 17.

An inner portion of the protective layer 30 vertically overlapped with the light emitting structure 10 may be vertically overlapped with the region for the protrusion 16. An outer portion of the protective layer 30 extends onto the contact part 34 of the capping layer 19, and is vertically overlapped with the contact part 34. The outer portion of the protective layer 30 may make contact with the pad 25, for example, may be provided at surrounding surfaces of the pad 25.

The inner portion of the protective layer 30 may be disposed between the light emitting structure 10 and the first electrode layer 20, and an outer portion of the protective layer 30 may be disposed between the transmissive layer 45 and the capping layer 19. The outer portion of the protective layer 30 extends to an outer region A1 from the sidewall of the light emitting structure 10 to prevent moisture from being infiltrated into the light emitting device.

The protective layer 30 may be defined as a channel layer, a low-reflective-index material, or an isolation layer. The protective layer 30 may be realized with an insulating material, for example, an oxide or a nitride. For example, the protective layer 30 may include at least one selected from the group consisting of $SiO_2$, $Si_xO_y$, $Si_3N_4$, $Si_xN_y$, $SiO_xN_y$, $Al_2O_3$, $TiO_2$, and AlN. The protective layer may be formed of a transparent material.

The light emitting device according to the embodiment may include an insulating layer 41 to electrically insulate the first electrode layer 20 from the second electrode layer 50. The insulating layer 41 may be disposed between the first electrode layer 20 and the second electrode layer 50. The protective layer 30 may make contact with the upper portion of the insulating layer 41. The insulating layer 41 may be realized with, for example, an oxide or a nitride. For example, the insulating layer 41 may be formed of at least one selected from the group consisting of $SiO_2$, $Si_xO_y$, $Si_3N_4$, $Si_xN_y$, $SiO_xN_y$, $Al_2O_3$, $TiO_2$, and AlN.

The insulating layer 41 may have the thickness in the range of 100 nm to 2000 nm. If the insulating layer 41 is formed with the thickness of less than 100 nm, a problem may occur in the insulating property. If the insulating layer 41 is formed with the thickness exceeding 2000 nm, the insulating layer 41 may be broken in the subsequent process. The insulating layer 41 may make contact with the top surface of the first electrode layer 20 and the top surface of the second electrode layer 50, and may be formed with a thickness thicker than that of each of the protective layer 30, the capping layer 19, the contact layer 15, and the reflective layer 17.

The second electrode layer 50 may include an anti-spread layer 52 provided under the insulating layer 41, a bonding layer 54 provided under the anti-spread layer 52, and a conductive support member 56 provided under the bonding layer 54, and may be electrically connected with the first semiconductor layer 11. In addition, the second electrode layer 50 includes one or two selected from among the anti-spread layer 52, the bonding layer 54, and the conductive support member 56, and at least one of the diffusion barrier layer 52 and the bonding layer 54 may not be formed.

The diffusion barrier layer 52 may include at least one of Cu, Ni, Ti, Ti—W, Cr, W, Pt, V, Fe, and Mo. The diffusion barrier layer 52 may function as a diffusion barrier layer between the insulating layer 41 and the bonding layer 54. The diffusion barrier layer 52 may be electrically connected with the bonding layer 54 and the conductive support member 56, and electrically connected with the first semiconductor layer 11.

The diffusion barrier layer 52 may prevent a material container in the bonding layer 54 from being spread toward the reflective layer 17 in the process of providing the bonding layer 54. The diffusion barrier layer 52 may prevent tin (Sn) contained in the bonding layer 54 from affecting the reflecting layer 17.

The bonding layer 56 may include barrier metal or bonding metal. For example, the bonding layer 56 may include at least one of Ti, Au, Sn, Ni, Cr, Ga, In, Bi, Cu, Ag, Nb, Pd and Ta. The conductive support member 56 may support the light emitting structure 10 according to the embodiment to serve as a heat radiation function. The bonding layer 54 may include a seed layer.

The conductive support member 56 may be formed of at least one of a metallic substrate, or a carrier substrate. The conductive support member 56 may include at least one of semiconductor substrates doped with Ti, Cr, Ni, Al, Pt, Au, W, Cu, Mo, Cu—W and impurities (Si, Ge, GaN, GaAs, ZnO, SiC, or SiGe). The conductive support member 56 is a layer to support the light emitting device 100, and may have the thickness corresponding to 80% or more of the thickness of the second electrode layer 50, that is, the thickness of at least 30 μm.

Meanwhile, the second contact layer 33 is provided in the first semiconductor layer 11, and makes contact with the first semiconductor layer 11. The top surface of the second contact layer 33 may be provided above the bottom surface of the first semiconductor layer 11, electrically connected with the first semiconductor layer 11, and insulated from the active layer 12 and the second semiconductor layer 13.

The second contact layer 33 may be electrically connected with the second electrode layer 50. The second contact layer 33 may be provided through the first electrode layer 20, the active layer 12, and the second semiconductor layer 13. The second contact layer 33 is provided in a recess 2 in the light emitting structure 10, and insulated from the active layer 12 and the second semiconductor layer 13 through the protective layer 30. A plurality of second contact layers 33 may be spaced apart from each other.

The second contact layer 33 may be connected with the protrusion 51 of the second electrode layer 50, and the protrusion 51 may protrude from the diffusion barrier layer 52. The protrusion 51 may pass through 41A formed in the protective layer 30 and the insulating layer 41, and may be insulated from the first electrode layer 20.

The second contact layer 33 may include at least one of, for example, Cr, V, W, Ti, Zn, Ni, Cu, Al, Au, and Mo. According to another example, the protrusion 51 may include at least one material constituting the diffusion barrier layer 52 and the bonding layer 54, but the embodiment is not limited thereto. For example, the protrusion 51 may include at least one of Ti, Au, Sn, Ni, Cr, Ga, In, Bi, Cu, Ag, Nb, Pd, and Ta.

The pad 25 may be electrically connected with the first electrode layer 20, and exposed to a region A1 outside the sidewall of the light emitting structure 10. One or a plurality of pads 25 may be provided. The pad 25 may include at least one of Cu, Ni, Ti, Ti—W, Cr, W, Pt, V, Fe, and Mo.

The transmissive layer 45 may protect the surface of the light emitting structure 10 and insulate the pad 25 from the light emitting structure 10. The transmissive layer 45 may make contact with a peripheral portion of the protective layer 30. The transmissive layer 45 may have a refractive index lower than that of a semiconductor layer material constituting the light emitting structure 10 to improve the light extraction efficiency. The transmissive layer 45 may be realized with an oxide or a nitride. For example, the transmissive layer 45 may be formed of at least one selected from the group consisting of $SiO_2$, $Si_xO_y$, $Si_3N_4$, $Si_xN_y$, $SiO_xN_y$, $Al_2O_3$, $TiO_2$, and AlN. Meanwhile, the transmissive layer 45 may be omitted depending on designs. According to the embodiment, the light emitting structure 10 may be driven by the first electrode layer 20 and the second electrode layer 50.

The light source module of the above-described embodiment (s) may be provided in a lighting system such as a light unit. The light source module may include at least one of a light guide plate, a diffusion sheet, and a prism sheet in a light output area. The lighting system may be a lighting lamp, a traffic light, a vehicle headlight, or a billboard. In addition, according to the light emitting device according to the embodiment, a phosphor film (not shown) may be provided on the light emitting structure 10.

<Lighting System>

The light emitting device according to the embodiment can be applied to a lighting system. The lighting system includes a structure in which a plurality of light emitting devices are arrayed. The lighting system includes the lighting apparatus shown in FIG. 12, and may include a lighting lamp, a signal lamp, a vehicle headlight, an electric sign board, and the like.

FIG. 12 is an exploded perspective view showing a display device having the light emitting device according to the embodiment.

Referring to FIG. 12, the lighting device according to the embodiment may include a cover 2100, a light source module 2200, a heat radiation member 2400, a power supply part 2600, an inner case 2700, and a socket 2800. In addition, the light emitting device according to the embodiment may further include at least one of a member 2300 and a holder 2500. The light source module 2200 may include the light emitting device or the light emitting device package according to the embodiment.

For example, the cover 2100 has the shape of a bulb, or a hemispherical shape. The cover 2100 may have a hollow structure, and a portion of the cover 2100 may be open. The cover 2100 may be optically connected to the light source module 2200, and may be coupled with the heat radiation member 2400. The cover 2100 may have a recess part coupled with the heat radiation member 2400.

The inner surface of the cover 2100 may be coated with ivory white pigments serving as a diffusing agent. The light emitted from the light source module 2200 may be scattered or diffused by using the ivory white material, so that the light can be discharged to the outside.

The cover 2100 may include glass, plastic, PP, PE, or PC. In this case, the PC represents superior light resistance, superior heat resistance, and superior strength. The cover 2100 may be transparent so that the light source module 2200 may be recognized at the outside. In addition, the cover 2100 may be opaque. The cover 2100 may be formed through a blow molding scheme.

The light source module 2200 may be disposed at one surface of the heat radiation member 2400. Accordingly, the heat emitted from the light source module 2200 is conducted to the heat radiation member 2400. The light source module 2200 may include a light emitting device 2210, a connection plate 2230, and a connector 2250.

The member 2300 is disposed on the top surface of the heat radiation member 2400, and has a guide groove 2310 having a plurality of light emitting devices 2210 and a connector 2250 inserted into the guide groove 2310. The guide groove 2310 corresponds to the substrate of the light emitting device 2210 and the connector 2250.

White pigments may be applied to or coated on the surface of the member 2300. The member 2300 reflects light, which reflected by the inner surface of the cover 2100 to return to the light source module 2200, toward the cover 2100. Accordingly, the light efficiency of the lighting apparatus according to the embodiment can be improved.

The member 2300 may include an insulating material. The connection plate 2230 of the light source module 2200 may include an electric-conductive material. Accordingly, the heat radiation member 2400 may be electrically connected to the connection plate 2230. The member 2300 includes an insulating material to prevent the electrical short between the connection plate 2230 and the heat radiation member 2400. The heat radiation member 2400 receives heat from the light source module 2200 and the heat from the power supply part 2600 and radiates the heats.

The holder 2500 blocks a receiving groove 2719 of an insulating part 2710 disposed in an internal case 2700. Accordingly, the power supply part 2600 received in the insulating part 2710 of the internal case 2700 is sealed. The holder 2500 has a guide protrusion part 2510. The guide protrusion part 2510 may include a hole allowing a protrusion part 2610 of the power supply part 2600 to pass therethrough.

The power supply part 2600 processes and transforms an electrical signal received from the outside and supplies the electrical signal to the light source module 2200. The power supply part 2600 is received in the receiving groove 2719 of the internal case 2700, and sealed in the internal case 2700 by the holder 2500. A supporting portion 2730 of the innernal case 2700 supports a lower portion of the heat radiation member 2400.

The power supply part 2600 may include a protrusion part 2610, a guide part 2630, a base 2650, and an extension part 2670.

The guide part 2630 protrudes outward from one side of the base 2650. The guide part 2630 may be inserted into the holder 2500. A plurality of parts may be disposed on one surface of the base 250. For example, the parts include a DC converter, a driving chip to drive the light source module 220, and an ESD (electrostatic discharge) protective device to protect the light source module 2200, but the embodiment is not limited thereto.

The extension part 2670 protrudes outward from another side of the base 2650. The extension part 2670 is inserted into the connection part 2750 of the internal case 2700, and receives an electrical signal from the outside. For example, the extension part 2670 may be equal to or less than the width of the connection part 2750 of the internal case 2700. The extension part 2670 may be electrically connected to the socket 2800 through a wire.

The internal case 2700 may be disposed therein with a molding part together with the power supply part 2600. The molding part is formed by hardening a molding liquid, so that the power supply part 2600 may be fixed into the internal case 2700.

The above description is not to be taken in a limiting sense, but is formed merely for the purpose of describing the general principles of exemplary embodiments, and many additional embodiments of this disclosure are possible. It is understood that no limitation of the scope of the disclosure is thereby intended. The scope of the disclosure should be determined with reference to the Claims. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

While the present invention has been described with reference to exemplary embodiments, it is to be understood that the invention is not limited to the disclosed exemplary embodiments. It will be apparent to those skilled in the art that various modifications and variations can be made in the present invention without departing from the spirit or scope of the invention. It can be seen that various modifications and applications are possible. For example, each component specifically shown in the embodiments can be modified and implemented. It is to be understood that the present invention is not limited to the above-described embodiments, and variations and modifications may be made without departing from the scope of the present invention.

INDUSTRIAL APPLICABILITY

The light-emitting device according to an embodiment can be applied to various lighting devices.

The light-emitting device according to an embodiment can be applied to indoor or outdoor lighting devices.

The invention claimed is:

1. A light-emitting device comprising:
a substrate including a body, and having first and second lead electrodes on the body;
a light-emitting chip disposed on the second lead electrode and electrically connected to the first and second lead electrodes;
a phosphor film disposed on the light-emitting chip;
a reflective member disposed around an outer sides of the light-emitting chip and the phosphor film; and
an optical lens including a lens portion of an aspheric shape and disposed on the phosphor film and the reflective member,
wherein the reflective member is disposed on the second lead electrode,
wherein the lens portion of the optical lens includes a first region overlapping with the light-emitting chip in a vertical direction and a second region overlapping with the reflective member in the vertical direction,
wherein a surface of the reflective member comprises a curved surface,
wherein the optical lens is disposed on the reflective member and disposed on the first and second lead electrodes exposed to an outer side of the reflective member, and
wherein a curved surface of the second region in the lens portion of the optical lens has a steeper slope than a curved surface of the first region.

2. The light-emitting device of claim 1, wherein an outer sides of the phosphor film are disposed outside further than a side surface of the light-emitting chip and contacts the reflective member.

3. The light-emitting device of claim 2, wherein the reflective member includes a resin material and has a first reflective portion disposed between the phosphor film and the substrate and a second reflective portion disposed on a side surface of the phosphor film.

4. The light-emitting device of claim 3, further comprising a conductive adhesive disposed between the light-emitting chip and the second lead electrode and connecting the light-emitting chip to the second lead electrode,
wherein the light-emitting chip includes a light-emitting structure and a pad disposed outside the light-emitting structure,
wherein the light-emitting chip is electrically connected to the second lead electrode through the conductive adhesive, and
wherein the reflective member has a third reflective portion disposed between the light-emitting structure and the pad of the light-emitting chip.

5. The light-emitting device of claim 4, wherein the third reflective portion of the reflective member is in contact with the pad and a portion of a wire connected to the pad.

6. The light-emitting device of claim 3, wherein a region between the reflective member, the phosphor film, and the light-emitting chip has no voids.

7. The light-emitting device of claim 1, wherein the optical lens has a buffer portion disposed on the substrate and extending from the lens portion, and
wherein the buffer portion extends outside the first and second lead electrodes in contact with the body along an edge of a top surface of the body.

8. The light-emitting device of claim 7, wherein a top surface of the buffer portion is lower than a top surface of the light-emitting chip.

9. The light-emitting device of claim 7, wherein a portion of the reflective member is disposed in a gap portion between the first and second lead electrodes, and
wherein the portion of the reflective member disposed on the gap portion extends close to a side surface of the substrate further than an outline of the reflective member disposed on a top surface of the second lead electrode.

10. The light-emitting device of claim 1, wherein the first region has a curved surface inclined in a direction parallel with the top surface of the light-emitting chip and the second region has a curved surface inclined in a direction perpendicular to the top surface of the light-emitting chip.

11. The light-emitting device of claim 7, wherein the body includes a ceramic material,
wherein the body includes a heat dissipation frame vertically overlapping the light-emitting chip, and first and second lead frames connected to the first and second lead electrodes, on a bottom surface of the body,
wherein a width of the heat dissipation frame in a first axial direction is two or more times widths of the first and second lead electrodes in the first axial direction, and wherein a length of the heat dissipation frame in a second axial direction is the same as lengths of the first and second lead electrodes in the second axial direction and smaller than a length of the body in the second axial direction.

12. The light-emitting device of claim 11, further comprising:
a first connection electrode connecting the first lead electrode and the first lead frame to each other; and
a second connection electrode connecting the second lead electrode and the second lead frame to each other,
wherein a straight line connecting the first and second electrodes to each other is disposed at a center portion of the light-emitting chip,
wherein a gap between the first and second connection electrodes is larger than a length of a bottom surface of the reflective member in the first axial direction, and
wherein the first and second connection electrodes overlap an outer portion of the optical lens in the vertical direction.

13. The light-emitting device of claim 12, wherein the first lead frame has a first protrusion protruding toward a first side of the body,
wherein the second lead frame has a second protrusion protruding toward a second side of the body, and
wherein the first and second protrusions protrude in the opposite directions and vertically overlap the first and second connection electrodes.

14. The light-emitting device of claim 12, wherein the second lead electrode has a larger area than that of the first lead electrode,
wherein the heat dissipation frame vertically overlaps the first and second lead electrodes, and
wherein an overlap area of the heat dissipation frame and the second lead electrode is larger than an overlap area of the heat dissipation frame and the first lead electrode.

15. The light-emitting device of claim 12, wherein the first lead electrode has an extension extending to an area close to the center portion of the light-emitting chip in the second axial direction, and includes a protective chip disposed on the extension of the first lead electrode and a wire connecting the protective chip to the first lead electrode, and
wherein a protective chip is disposed on the same line with the center portion of the light-emitting chip in the second axial direction.

16. The light-emitting device of claim 1, wherein a thickness of the optical lens is in the range of 60% to 65% of a gap between a bottom surface of the substrate and an apex of the lens.

17. The light-emitting device of claim 1, wherein the body has an edge region where the first and second lead electrodes are open,
wherein the edge region is defined around edges of the body in the first axial direction and the second axial direction,
wherein the optical lens has a buffer portion disposed on the substrate and extending from the lens portion, and
wherein the buffer portion contacts the edge region of the body.

18. The light-emitting device of claim 17, wherein a width of the edge region is smaller than the gap between the first and second lead electrodes, and
wherein the first lead electrode has a polarity mark disposed at a corner portion of the body and connected to the edge region.

19. The light-emitting device of claim 1, wherein a transparent material is disposed on an interface between the reflective member and an outer surface of the phosphor film.

* * * * *